United States Patent
Fraboulet et al.

(10) Patent No.: US 7,217,946 B2
(45) Date of Patent: May 15, 2007

(54) METHOD FOR MAKING A WIRE NANOSTRUCTURE IN A SEMICONDUCTOR FILM

(75) Inventors: David Fraboulet, Quaix en Chartreuse (FR); Jacques Gautier, Coublevie (FR); Didier Tonneau, Marseille (FR); Nicolas Clement, Toulon (FR); Vincent Bouchiat, Biviers (FR)

(73) Assignee: Commissariat a l'Energie Atomique, Paris (FR)

( * ) Notice: Subject to any disclaimer, the term of this patent is extended or adjusted under 35 U.S.C. 154(b) by 218 days.

(21) Appl. No.: 10/529,937

(22) PCT Filed: Oct. 2, 2003

(86) PCT No.: PCT/FR03/50072

§ 371 (c)(1),
(2), (4) Date: Apr. 1, 2005

(87) PCT Pub. No.: WO2004/032182

PCT Pub. Date: Apr. 15, 2004

(65) Prior Publication Data

US 2006/0286788 A1   Dec. 21, 2006

(30) Foreign Application Priority Data

Oct. 3, 2002 (FR) .................................. 02 12235

(51) Int. Cl.
*H01L 29/00* (2006.01)
(52) U.S. Cl. .......................................... 257/9; 977/762
(58) Field of Classification Search ............... 977/762; 257/E29.069, E29.085, E29.091, E29.097
See application file for complete search history.

(56) References Cited

U.S. PATENT DOCUMENTS 6,882,051 B2 *   4/2005   Majumdar et al. .......... 257/746

FOREIGN PATENT DOCUMENTS

EP   0 557 590 A1   9/1993

OTHER PUBLICATIONS

Ogawa, Tomoya, et al.; "Real-Time Observation of Electron-Beam Induced Mass Transport in Strained InGaAs/AlGaAs Layers on GaAs (100) and (311)B Substrates," Jpn. J. Appl. Phys., vol. 38; Feb. 1999; pp. 1040-1043.
Yagi, Katsumichi, et al.; "Step bunching, step wandering and faceting: self-organization at Si surfaces," Surface Science Reports 43 (2001); pp. 45-126.
T. Sameshima, et al., "Rapid crystallization of silicon films using electrical-current-induced joule heating," J. Appl Phys.; vol. 89, No. 10; May 15, 2001; pp. 5362-5367.
International Search Report; Aug. 12, 2004; 2 pp.

* cited by examiner

*Primary Examiner*—Tarifur Chowdhury
*Assistant Examiner*—Paul E Patton
(74) *Attorney, Agent, or Firm*—Thelen Reid Brown Raysman & Stiener LLP

(57) ABSTRACT

This invention relates to a process for manufacturing nanowire structures, the process comprising the following steps:
  manufacture of a thin semiconductor film (1) extending between a first terminal (4) and a second terminal (5), and
  passage of a current between the first and the second terminals so as to form at least one continuous overthickness (R1, R2, R3) in the thin semiconductor film by migration of a fraction of the semiconductor material, under the action of the current, the continuous overthickness being formed along the direction of the current that passes through the film.

7 Claims, 4 Drawing Sheets

METHOD FOR MAKING A WIRE NANOSTRUCTURE IN A SEMICONDUCTOR FILM

CROSS-REFERENCE TO RELATED APPLICATION

This application claims priority based on International Patent Application No. PCT/FR2003/050072, entitled "Method for Making a Wire Nanostructure in a Semiconductor Film" by David FRABOULET, Jacques GAUTIER, Didier TONNEAU and Nicolas CLEMENT, which claims priority of French Application No. 02/12235, filed on Oct. 3, 2002, and which was not published in English.

TECHNICAL DOMAIN AND PRIOR ART

The invention relates to a process for manufacturing a nanowire structure in a semiconductor film.

The invention is used in one particularly advantageous application for the production of nano-circuits and particularly for the manufacture of MOS (Metal Oxide Semiconductor) nano-circuits.

According to prior art, nanowire structures are manufactured in semiconductor films by DUV (Deep Ultra Violet) lithography, or by electron beam lithography, or by an alternation of lithography and hidden lithography. In the latter case, the resolution of the structures obtained can be doubled.

The smallest nanowire structures obtained in the past have a width equal to approximately 100 nm.

This limitation is opposed to the design of smaller nano-circuits, for example with dimensions of the order of about ten nanometers.

The invention does not have this disadvantage.

PRESENTATION OF THE INVENTION

The invention relates to a process for manufacturing nanowire structures. The process comprises:
manufacture of a thin semiconductor film extending between a first terminal and a second terminal, and
passage of a current between the first and the second terminal so as to form at least one continuous over-thickness in the thin semiconductor film by migration of a fraction of the semiconductor material, under the action of the current, the continuous overthickness being formed along the direction of the current that passes through the film.

The invention also relates to a process for etching a layer using a hard mask, in which the hard mask used is a nanowire structure obtained by the process for manufacturing a nanowire structure according to the invention.

According to the preferred embodiment of the invention, the semiconductor is n doped monocrystalline silicon. Other embodiments are also possible, as will become clearer after reading the following description.

BRIEF DESCRIPTION OF THE FIGURES

Other special features and advantages of the invention will become clearer after reading the description of a preferred embodiment with reference to the appended figures, wherein.

DETAILED DESCRIPTION OF EMBODIMENTS OF THE INVENTION

Figure 1:
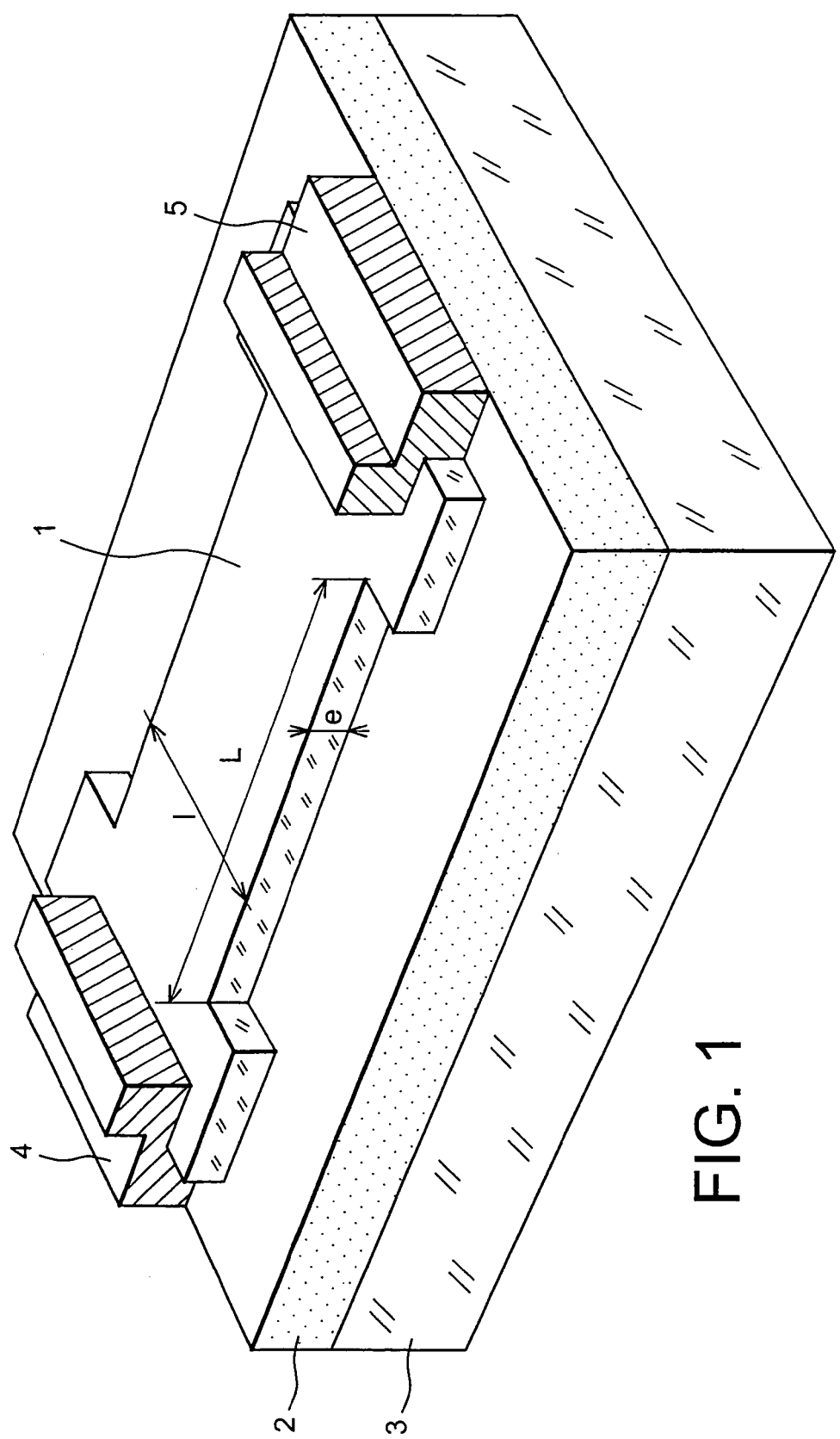
FIG. 1 represents a thin semiconductor film for the production of a nanowire structure according to the invention.

FIG. 1 shows a thin semiconductor film for making a nanowire structure according to the invention.

According to the preferred embodiment of the invention, the thin semiconductor film 1 is an n doped monocrystalline silicon thin film. The n doped monocrystalline silicon thin film is formed on a layer of silica 2 ($SiO_2$) that is itself formed on a thick silicon layer 3. The thin doped monocrystalline silicon film is formed by any known lithography technique and/or any known etching process. For example, the AFM (Atomic Force Microscope) lithography technique may be used as described in the article entitled "*Electronic transport properties of single-crystal silicon nanowires fabricated using an atomic force microscope*" published in Physica E, vol. 13, 999–1002 (2002). The doped monocrystalline semiconductor thin film 1 is connected to a first terminal 4 at one end, and to a second terminal 5 at a second end. The terminals 4 and 5 form the electrical conducting contacts. For example, they may be made from degenerated silicon.

As a non-limitative example, the results that will be given below correspond to an n doped monocrystalline silicon thin film with a thickness e typically between 15 and 20 nm, with width l equal to approximately 0.7 µm and length L equal to approximately 1.3 µm.

Figure 2:
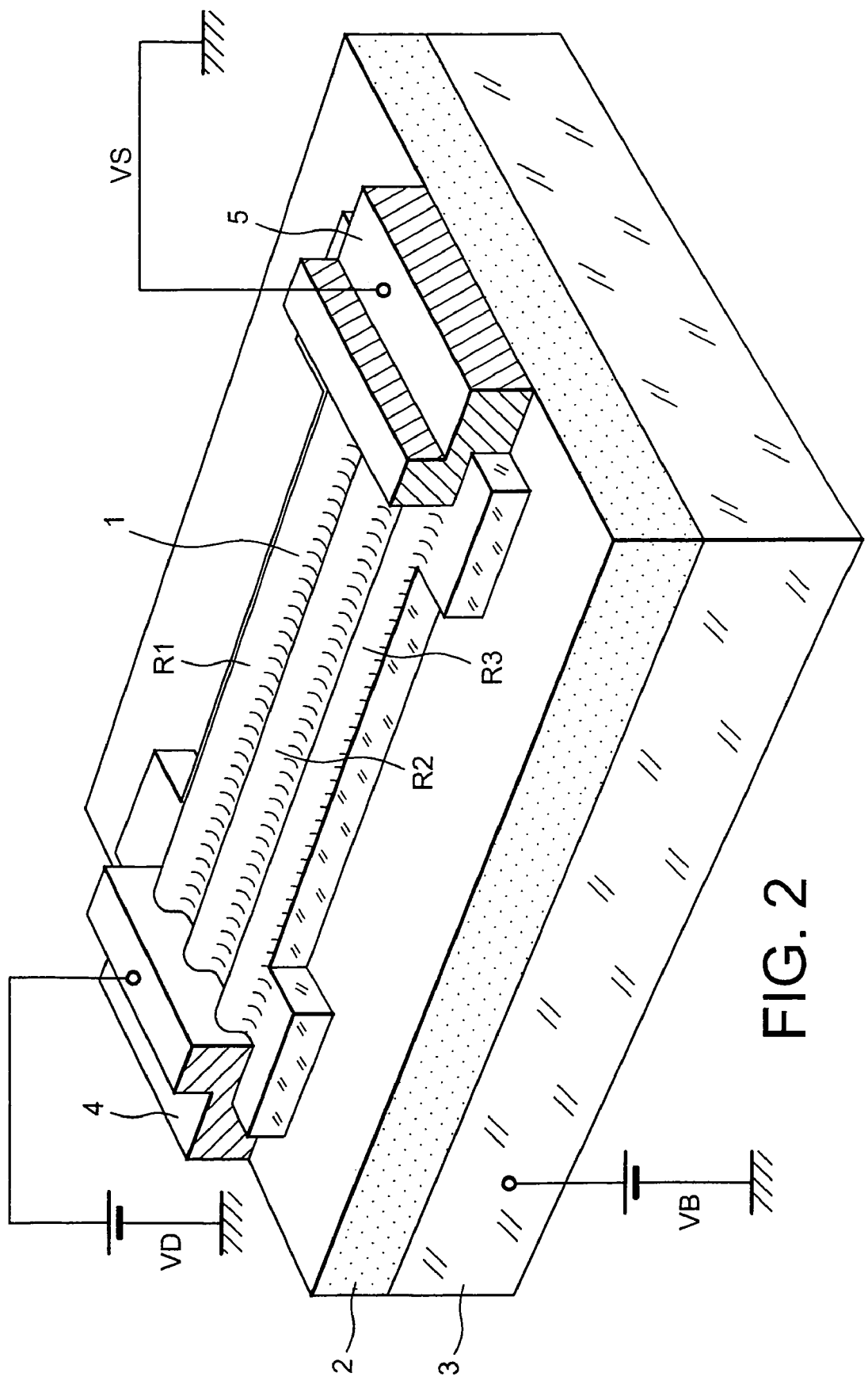
FIG. 2 represents a nanowire structure obtained following the passage of a current in a thin semiconductor film as shown in FIG. 1.
Figure 3:
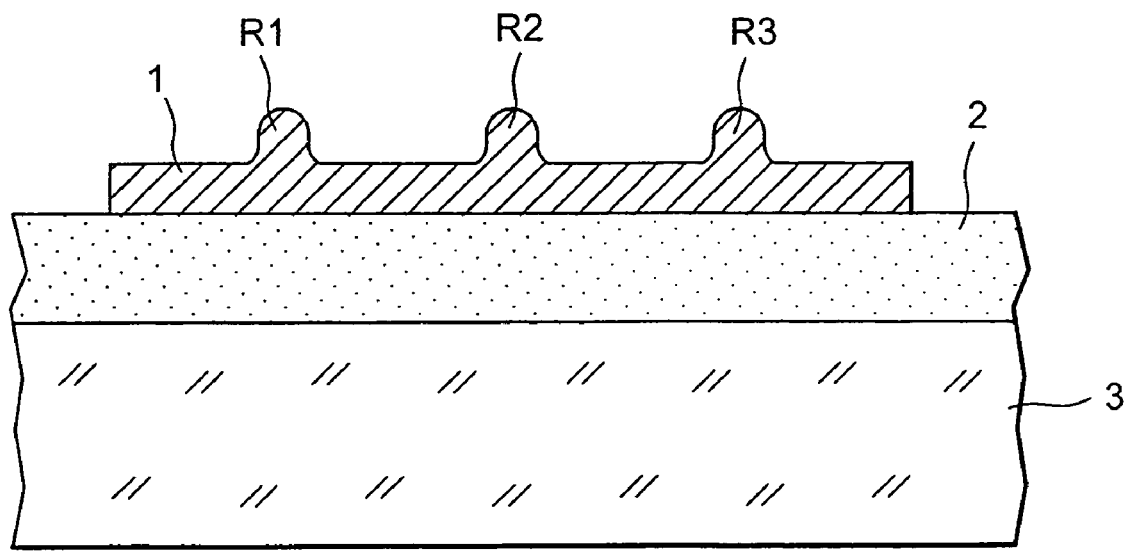
FIG. 3 shows a sectional view of the structure shown in FIG. 2.

FIG. 2 shows an example of nanowire structure obtained following passage of a current in a thin semiconductor film like that shown in FIG. 1, and FIG. 3 is a cross-sectional view of the nanowire structure shown in FIG. 2.

For passage of current, the terminal 4 is connected to a potential VD, the terminal 5 to a reference potential VS (for example the circuit ground), and the thick layer of monocrystalline silicon 3 is connected to a substrate potential VB.

The potential difference VD–VS introduces a current in the semiconductor film 1. Unexpectedly, the structure of the thin layer of monocrystalline silicon 1 is modified as current passes through it. This modification consists of the appearance of overthicknesses that form along the direction of the current that passes through the film.

The example shown in FIG. 2 shows linear overthicknesses. The invention also relates to other forms of overthicknesses due to the fact that the direction of the current that passes through the film is not necessarily linear but it may be in other forms.

In the example chosen, the structure modification appeared for a potential difference VD–VS greater than 15V corresponding to a value of the current density J equal to approximately $2 \times 10^6$ A.cm$^2$. Depending on the chosen example, there are three overthicknesses, R1, R2 and R3. The width of each is equal to approximately 45 nm and their height is equal to approximately 7 nm. Overthicknesses are formed due to the fact that the conductivity of the thin film of monocrystalline silicon is not uniform. High conductivity zones lead to a migration of material and consequently to the formation of overthicknesses. Material is migrated along the direction of the electrical field, in the direction opposite the direction of the electron current, unlike what happens during the electromigration phenomenon with metals. Overthickness zones are stable in time. Thus, it has been observed that these zones do not vary significantly after a duration of 30 minutes, and that the value of the current that passes through them is approximately the same. Application of a potential difference equal to 20V has caused failure of the circuit.

In general, it has been observed that the current passage time does not have an influence on the formation of overthicknesses. All that needs to be controlled is the current density in the monocrystalline semiconductor film. The range of current densities that can cause the formation of overthicknesses depends on the semiconductor. The maximum value is given by the limit beyond which the circuit fails. In the case of silicon, overthicknesses appear for a current density equal to between approximately $2 \times 10^6$ A $cm^2$ and $4 \times 10^6$ A $cm^2$. The concentration of doping agents is adapted so as to obtain a sufficient current density to cause migration of material. In the case of silicon, doping may for example be equal to approximately 8 E18/$cm^3$.

Figure 4:
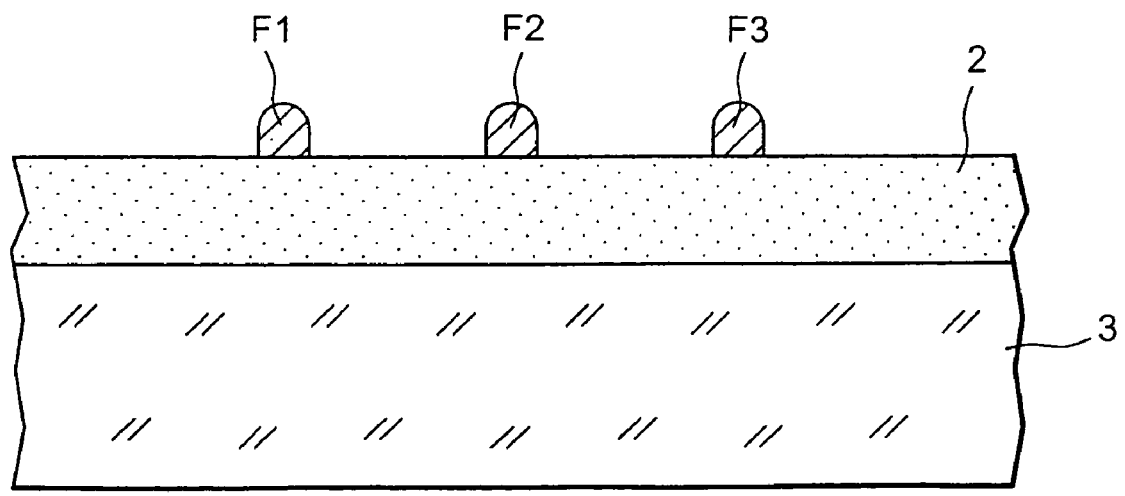
FIG. 4 shows an additional step in the formation of nanowires from the nanowire structure shown in FIG. 2.

FIG. 4 shows an additional step in the formation of nanowires from the nanowire structure shown in FIGS. 2 and 3. The thin film 1 between overthicknesses R1, R2 and R3 is then etched so as to form the nanowires F1, F2, F3 on the surface of the silica layer 2.

Figure 5A:
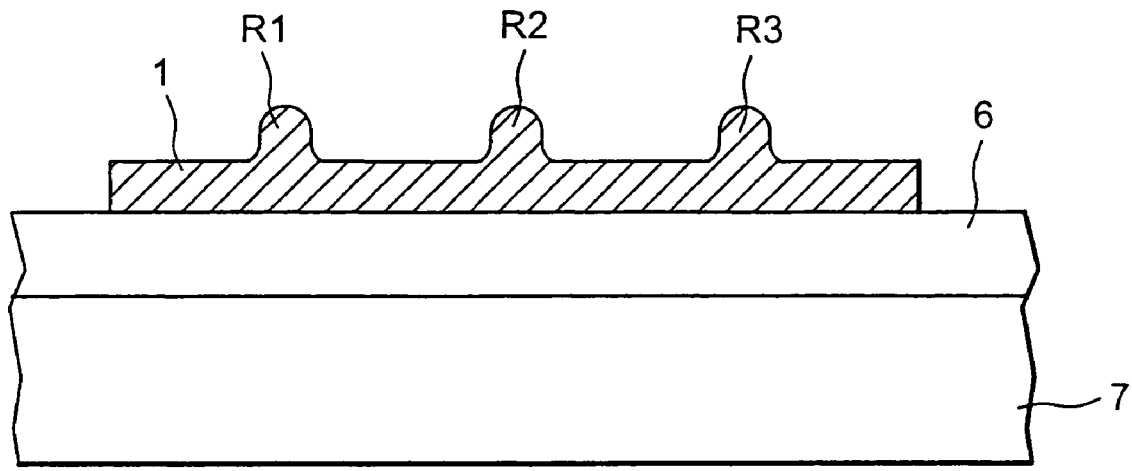
FIGS. 5A and 5B show etching steps using the previously obtained nanowire structure as the etching mask.
Figure 5B:
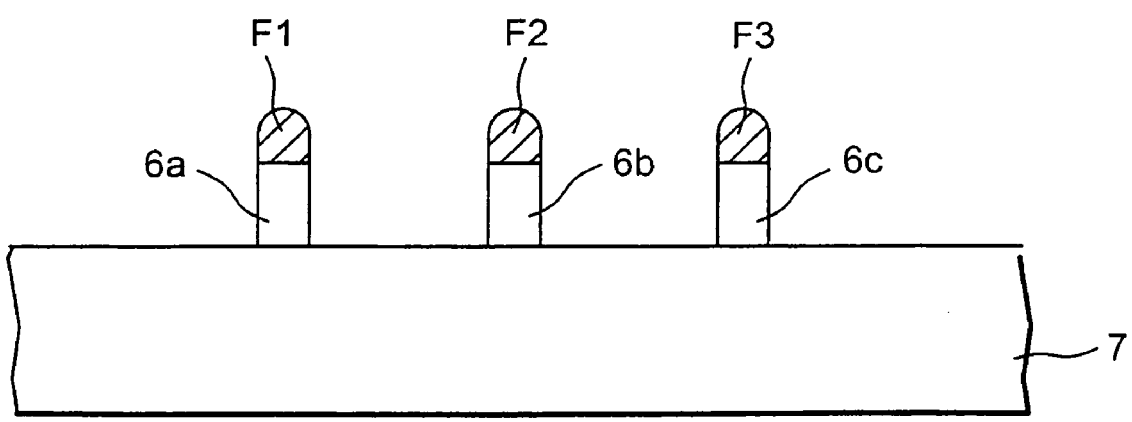

FIGS. 5A and 5B show etching steps using the previously obtained nanowire structure as the etching mask. The nanowire structure is firstly transferred onto a stack of layers 6, 7 (see FIG. 5A). Etching of the thin film 1 and the layer 6 between the overthicknesses R1, R2 and R3 causes the formation of nanowires F1, F2 and F3 carried by the nanostructures 6a, 6b and 6c respectively (see FIG. 5B). It is also possible to obtain a structure like that shown in FIG. 5B by transferring only the wires F1, F2 and F3 onto the layer 6. Furthermore, if there is no process for selective etching of layer 6 with respect to the thin semiconductor film 1, it is also possible to use an intermediate layer on which the nano-structure is transferred before the step to etch the layer 6, in a known manner using the SOI (Silicon On Insulator) technology.

According to the preferred embodiment of the invention described above, the semiconductor is an n doped monocrystalline silicon.

According to other embodiments of the invention, the semiconductor may be n or p doped. It may be made of silicon, but it may also be an SiGe or SiGeC alloy. The semiconductor may also be not doped. In the case of an undoped semiconductor, the current causing migration of material is obtained by creation of a density of carriers due to the electrostatic influence of a grid, for example made of polycrystalline silicon or metal located close to the thin semiconductor film. As a non-limitative example, the substrate on which the thin semiconductor film is formed may also act as this grid and in this case, the semiconductor film is very thin, for example a few nanometers thick.

The invention claimed is:

1. Process for manufacturing nanowire structures, characterised in that it comprises:
    manufacture of a thin semiconductor film (1) extending between a first terminal (4) and a second terminal (5), and
    passage of a current between the first and the second terminals so as to form at least one continuous overthickness (R1, R2, R3) in the thin semiconductor film by migration of a fraction of the semiconductor material under the action of the current, the continuous overthickness being formed along the direction of the current that passes through the film.

2. Process according to claim 1, characterised in that the thin semiconductor film is obtained by lithography and/or etching of a thin semiconductor layer formed on an insulating layer.

3. Process according to claim 1, characterised in that said thin film is etched to form a set of nanowires (F1, F2, F3) after the formation of the linear overthickness due to passage of a current in the thin semiconductor film.

4. Process according to claim 1, characterised in that the thin semiconductor film is a thin film of Si, SiGe or SiGeC.

5. Process according to claim 1, characterised in that the semiconductor is doped.

6. Process according to claim 1, characterised in that the semiconductor is monocrystalline.

7. Process for etching a layer using a hard mask, characterised in that the hard mask used is a nanowire structure obtained by a manufacturing process according to claim 1.

* * * * *